United States Patent
Lai et al.

(10) Patent No.: US 7,620,861 B2
(45) Date of Patent: Nov. 17, 2009

(54) METHOD AND APPARATUS FOR TESTING INTEGRATED CIRCUITS BY EMPLOYING TEST VECTOR PATTERNS THAT SATISFY PASSBAND REQUIREMENTS IMPOSED BY COMMUNICATION CHANNELS

(75) Inventors: Bosco Chun Sang Lai, Markham (CA); Sunny Lai-Ming Chang, Markham (CA); Lawrence Wai Cheung Ho, Mississauga (CA)

(73) Assignee: KingTiger Technology (Canada) Inc., Markham, Ontario (CA)

( * ) Notice: Subject to any disclaimer, the term of this patent is extended or adjusted under 35 U.S.C. 154(b) by 239 days.

(21) Appl. No.: 11/779,629

(22) Filed: Jul. 18, 2007

(65) Prior Publication Data

US 2008/0301509 A1    Dec. 4, 2008

Related U.S. Application Data

(60) Provisional application No. 60/941,185, filed on May 31, 2007.

(51) Int. Cl.
*G01R 31/28* (2006.01)
(52) U.S. Cl. ............ 714/724; 714/25; 714/30; 714/32; 714/43; 714/709; 714/712; 714/715; 714/716; 714/717; 714/718; 714/719; 714/720; 714/733; 714/734; 714/736; 714/738; 714/742; 375/225; 370/222
(58) Field of Classification Search .................. None
See application file for complete search history.

(56) References Cited

U.S. PATENT DOCUMENTS

| | | | |
|---|---|---|---|
| 4,379,259 A | 4/1983 | Varadi et al. | |
| 4,484,329 A | 11/1984 | Slamka et al. | |
| 4,821,238 A | 4/1989 | Tatematsu | |
| 4,965,799 A | 10/1990 | Green et al. | |
| 5,794,175 A | 8/1998 | Conner | |
| 5,919,270 A * | 7/1999 | Arkin | 714/736 |
| 5,959,914 A | 9/1999 | Gates et al. | |
| 5,995,424 A * | 11/1999 | Lawrence et al. | 365/201 |
| 6,014,759 A | 1/2000 | Manning | |
| 6,055,653 A | 4/2000 | LeBlanc et al. | |
| 6,055,661 A | 4/2000 | Luk | |
| 6,058,055 A | 5/2000 | Brunelle | |
| 6,134,690 A | 10/2000 | Ivaturi et al. | |
| 6,178,526 B1 | 1/2001 | Nguyen et al. | |
| 6,202,186 B1 * | 3/2001 | Oonk | 714/738 |
| 6,275,962 B1 | 8/2001 | Fuller et al. | |
| 6,345,372 B1 | 2/2002 | Dieckmann et al. | |

(Continued)

OTHER PUBLICATIONS

Co-pending U.S. Appl. No. 11/933,796, filed Nov. 1, 2007 Lai, et al.

*Primary Examiner*—John P Trimmings
(74) *Attorney, Agent, or Firm*—Bereskin & Parr LLP/S.E.N.C.R.L., s.r.l.

(57) ABSTRACT

Embodiments of an apparatus and method for high-speed testing of a device under test are described herein, where the device under test is coupled to a tester via a limited passband communication channel. A plurality of test vector patterns is generated having characteristics such that when a given test vector pattern is transmitted electrically at a transmission rate via the communication channel, the test vector pattern has a frequency content that is less than the frequency content of a high frequency test vector pattern if the high frequency test vector pattern were to be transmitted electrically at the transmission rate via the communication channel, and such that the frequency content of each test vector pattern when transmitted electrically at the transmission rate via the communication channel falls within the passband associated with the communication channel.

20 Claims, 7 Drawing Sheets

U.S. PATENT DOCUMENTS

| | | |
|---|---|---|
| 6,389,525 B1 * | 5/2002 | Reichert et al. ............. 711/217 |
| 6,425,095 B1 | 7/2002 | Yasui |
| 6,452,411 B1 | 9/2002 | Miller et al. |
| 6,525,523 B1 | 2/2003 | Soma et al. |
| 6,546,511 B1 | 4/2003 | Sim et al. |
| 6,574,759 B1 | 6/2003 | Woo et al. |
| 6,594,595 B2 | 7/2003 | Yamaguchi et al. |
| 6,598,004 B1 | 7/2003 | Ishida et al. |
| 6,615,379 B1 | 9/2003 | Tripp et al. |
| 6,646,936 B2 | 11/2003 | Hamamatsu et al. |
| 6,687,629 B1 | 2/2004 | Yamaguchi et al. |
| 6,701,474 B2 | 3/2004 | Cooke et al. |
| 6,731,125 B2 | 5/2004 | Chang |
| 6,737,852 B2 | 5/2004 | Soma et al. |
| 6,754,117 B2 | 6/2004 | Jeddeloh |
| 6,775,321 B1 | 8/2004 | Soma et al. |
| 6,795,496 B1 | 9/2004 | Soma et al. |
| 6,851,076 B1 * | 2/2005 | Cook et al. ................. 714/718 |
| 6,880,118 B2 | 4/2005 | Chen et al. |
| 6,888,366 B2 | 5/2005 | Kim et al. |
| 6,922,439 B2 | 7/2005 | Yamaguchi et al. |
| 7,054,358 B2 | 5/2006 | Yamaguchi et al. |
| 7,080,292 B2 * | 7/2006 | Moore et al. ................. 714/700 |
| 7,085,980 B2 | 8/2006 | Martin-de-Nicolas et al. |
| 7,088,122 B2 | 8/2006 | Hartmann et al. |
| 7,092,902 B2 | 8/2006 | Eldridge et al. |
| 7,119,567 B2 | 10/2006 | Ma et al. |
| 7,127,018 B2 | 10/2006 | Yamaguchi et al. |
| 7,131,046 B2 | 10/2006 | Volkerink et al. |
| 7,142,003 B2 * | 11/2006 | Kanbayashi et al. ........ 324/765 |
| 7,203,229 B1 | 4/2007 | Ishida et al. |
| 7,272,756 B2 * | 9/2007 | Brink et al. ................. 714/715 |
| 2001/0047500 A1 * | 11/2001 | Tsuto ......................... 714/738 |
| 2002/0181678 A1 * | 12/2002 | Lai et al. ................. 379/93.32 |
| 2003/0208711 A1 * | 11/2003 | Frame et al. ................ 714/742 |
| 2005/0185708 A1 | 8/2005 | Yamaguchi et al. |
| 2007/0036256 A1 | 2/2007 | Yamaguchi et al. |
| 2007/0099590 A1 | 5/2007 | Okabe et al. |
| 2008/0201621 A1 * | 8/2008 | Sato ........................... 714/718 |
| 2009/0115443 A1 | 5/2009 | Lai et al. |

* cited by examiner

METHOD AND APPARATUS FOR TESTING INTEGRATED CIRCUITS BY EMPLOYING TEST VECTOR PATTERNS THAT SATISFY PASSBAND REQUIREMENTS IMPOSED BY COMMUNICATION CHANNELS

CROSS REFERENCE TO RELATED APPLICATIONS

This application claims the benefit of U.S. Provisional Application No. 60/941,185, filed May 31, 2007. The contents of U.S. Provisional Application No. 60/941,185 are hereby incorporated by reference.

TECHNICAL FIELD

The described embodiments relate to a method and apparatus for testing integrated circuit devices. More particularly, the described embodiments relate to the testing of integrated circuit devices using test vector patterns that satisfy passband requirements imposed upon them by practical limitations on the communication channels, as well as the apparatus capable of generating the test vector patterns.

BACKGROUND

Integrated circuit devices are typically subject to rigorous testing before they are sold or put to their intended use. In particular, each integrated circuit device is tested to determine whether or not certain specifications for that type of device, as determined and set by the manufacturer, are met.

Complete testing of an integrated circuit device comprises both functional testing as well as application-specific testing. Functional testing relates to whether or not the hardware found within the integrated circuit device is free from defects and meets manufacturers' specifications. For example, if the integrated circuit device is or comprises a memory component such as a memory module or a memory device, functional testing relates to whether or not a digital value written to a cell of memory will later be retrieved without error, regardless of how the memory module or memory device is implemented.

Functional testing also relates to whether or not certain critical operating characteristics of the integrated circuit device fall within the allowable range of values. These critical operating characteristics include such characteristics as power consumption, standby current, leakage current, voltage levels, and access time. The allowable range may equally be set by the manufacturer of the device or by the corresponding appropriate standards.

Functional testing is oriented toward discovering whether or not the integrated circuit device under test is likely to fail during its intended use or application. It involves testing integrated circuit devices to verify how they execute a set of functions during testing procedures that are specifically designed for this purpose.

Complete testing of an integrated circuit device also involves application-specific testing. During application-specific testing, integrated circuit devices are subject to testing of their system behavior in order to detect their behavioral failures. Behavioral failure is a type of failure that occurs when an integrated circuit device is operated within an actual application system. For example, it may be a failure that occurs as a result of a specific command or access sequence to a memory device or memory module found in normal PC operations.

It is not necessarily the case that functional testing will detect behavioral failures because, during that type of testing, the operation of the integrated circuit device under test is not necessarily indicative of how the device will behave during its intended application. Accordingly, complete and comprehensive testing of an integrated circuit device requires application-specific testing in addition to functional testing. Functional testing alone is not sufficient.

Though they may have different objectives, both functional and application-specific testing of integrated circuit devices involve the use of test vector patterns. In particular, in either case, test vector patterns are generated by an appropriate test vector generator and then transmitted to the device under test across a communication channel. Ideally, the test vector patterns are transmitted at a rate that is equivalent to the full processing speed of the integrated circuit device because that is the speed at which the device would ideally operate under normal applications.

The data processing speeds at which integrated circuit devices process data are ever increasing. Current processing speeds typically exceed 1 GHz. Future processing speeds might reach 20 GHz or higher. In the context of testing integrated circuit devices, the increasing processing speeds of integrated circuit devices correlates to greater demands on the transmission rates of the test vector patterns. Only where the transmission rate of the test vector can match the full processing speed of the device will the most useful and rigorous testing of the device take place.

However, test vector patterns must be transmitted to the device under test over a communication channel, and all physical communication channels impose passband limitations on the electrical signals passing over them. Common communication channels used in the testing of integrated circuit devices include coaxial cables and Printed Circuit Board (PCB) layout traces. Other types of communication channels are known.

One aspect of the communication channel's passband is a high-frequency cutoff characteristic with respect to transmitted signals. In other words, all frequencies below a critical frequency will transmit with little or no attenuation of signal strength or distortion of edges. However, all frequencies above that critical frequency will only transmit with attenuation of signal strength. As a result, a mixed frequency electrical signal potentially may transmit with very significant signal distortion or attenuation, depending on how much of the signal's frequency content falls above the critical frequency.

An additional constraint on a maximum frequency of test vector waveforms transmitting across communication channels is degradation of waveform integrity on account of reflections. Electrical waveforms transmitted across communication channels have the potential to reflect at the channel's terminal points. Those reflections superimpose onto the original waveform causing distortion in the form of degradation of signal integrity. Mitigating the effect of waveform reflection involves limiting the period of a transmitted waveform to above a certain threshold value. In terms of frequency, this constraint manifests as a limit on a maximum frequency for transmitted waveforms at which no practically significant distortion occurs, in line with the constraint imposed by the passband characteristic of the communication channel.

Depending on either or both of the passband or the reflection characteristic of the communication channel used in the device test, the desired test vector patterns to be used in the test often will not transmit across the communication channel without significant distortion. If the desired test vector has significant frequency content falling outside the passband of the communication channel, then the resulting distortion may render the test vector unusable for testing purposes. It is possible that signal distortions of this kind might not exhibit itself within real application systems, in which signals typically travel much shorter distances and in which signal connections are optimally terminated.

Test vector patterns, when transmitted over a communication channel to the device under test, are in the form of time-varying electrical signals. At the input to the device under test, the transmitted electrical signal is converted into its digital representation through the process of sampling. The well-known Nyquist Theorem provides a fundamental relationship between sample rate and the maximum allowable frequency of the electrical signal undergoing sampling. According to the theorem, in order to avoid aliasing effects, the electrical signal must be sampled at a rate that is equal to at least twice the maximum frequency of the signal undergoing sampling.

According to current processes, sampling of electrical signals often involves the use of a sampling clock, typically a square-wave pulse train. In one form, samples of electrical signals are taken at every rising or every falling edge of the sampling clock. In this manner, the sampler will take one sample of the signal every period of the sampling clock. However, in another form, samples are taken at every rising edge, as well as every falling edge, of the sampling clock. In this manner, the sampler will take two samples for every period of the sampling clock. It is therefore possible, using this second form of sampling, to achieve twice the sampling rate for a given clock frequency, or else half the clock frequency for a given sampling rate.

Thus, accepted communication theory establishes a direct relationship between the processing speed of the integrated circuit device and the passband of the communication channel for ideal testing. Under ideal conditions, the integrated circuit device samples at a rate equal to its processing speed. That fixes the transmission rate of the test vector pattern across the communication channel at an equal rate, which in turn fixes the required passband of the communication channel. The basic relationship is that, in order for the communication channel to transmit every possible test vector pattern without distortion under these conditions, it must have a passband that is not less than half of the full processing speed of the integrated circuit device. For example, if the device processes at 2 Gb/s, then the channel should have a passband of at least 1 GHz.

SUMMARY

In the above example, if the communication channel used in the test does not meet the above-described constraint, namely that its passband is less than half the full processing speed of the integrated circuit device, then the test engineer might consider the following options: (a) test the device at a speed that does not engage the above-described constraint; (b) test the device using a different communication channel, specifically one that meets the above-described constraint; (c) test the device using alternative test vector patterns that do not engage the above-described constraint. With respect to the use of alternative test vector patterns, it is further desirable to choose test vector patterns that provide comprehensive testing of the integrated circuit device.

At least some embodiments described herein relate to a method for high-speed testing of a device under test (DUT) coupled to a tester via a limited passband communication channel. In one broad aspect, there is provided a method for high-speed testing of a device under test coupled to a tester via a limited passband communication channel, the method comprising: generating a finite plurality of test vector patterns; transmitting each of the plurality of test vector patterns electrically to the device under test via the communication channel; for each of the plurality of test vector patterns transmitted electrically to the device under test, receiving a bit pattern in response to the transmission of the respective test vector pattern, the bit pattern having been transmitted electrically via the communication channel from the device under test, and performing a comparison of the bit pattern received in response to the transmission of the respective test vector pattern with a reference bit pattern associated with the respective test vector pattern; determining at least one test outcome, wherein each of the at least one test outcome is based on the comparison performed for a corresponding one of the plurality of test vector patterns; and at least one of recording and outputting the at least one test outcome; wherein each of the plurality of test vector patterns, when transmitted electrically at a transmission rate via the communication channel, has a frequency content that is less than the frequency content of a high frequency test vector pattern if the high frequency test vector pattern were to be transmitted electrically at the transmission rate via the communication channel, the frequency content of the high frequency test vector pattern falling outside of the passband associated with the communication channel; and wherein the frequency content of each test vector pattern when transmitted electrically at the transmission rate via the communication channel falls within the passband associated with the communication channel.

In another broad aspect, the device under test comprises at least one memory component each comprising a plurality of cells. In one embodiment, the plurality of test vector patterns comprises a first test vector pattern and at least one other test vector pattern; wherein the first test vector pattern comprises a sequence of bit pluralities, each bit plurality comprising one or more bits; wherein all bits in any one bit plurality have the same value; and wherein for each bit plurality of the sequence, the value of the bits therein have a value different than the value of the bits in all bit pluralities of the sequence adjacent thereto.

In another broad aspect, the device under test comprises at least one application-specific integrated circuit. In one embodiment, for each of the plurality of test vector patterns, the reference bit pattern associated with the respective test vector pattern is the expected logical output of the application-specific integrated circuit if the respective test vector pattern were to be provided as input to the application-specific integrated circuit.

In another broad aspect, there is provided a tester configured to perform the method described herein in accordance with at least one embodiment.

Features of these and other aspects and embodiments of the system and method described herein are provided below.

BRIEF DESCRIPTION OF THE DRAWINGS

Embodiments are described below in further detail, by way of example, with reference to the accompanying drawings, in which.

DETAILED DESCRIPTION

Figure 1A:
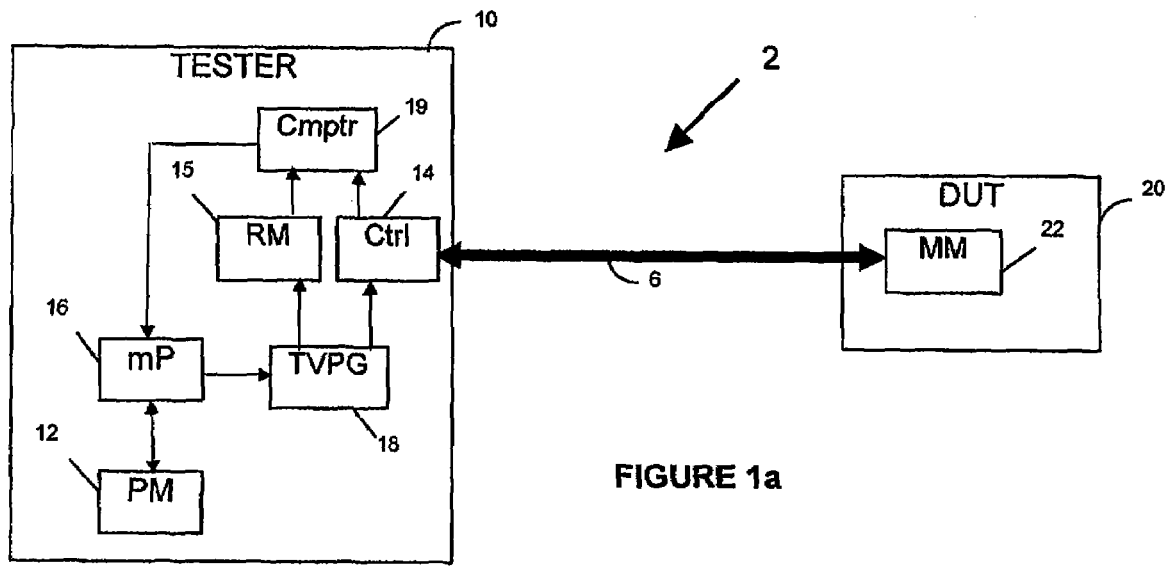
FIG. 1a is a block diagram of a testing system comprising an integrated circuit device under test and a tester module across a passband limited communication channel in at least one embodiment.

The described embodiments are applicable to methods and apparatus for testing integrated circuits by employing test vector patterns that satisfy passband requirements imposed by communication channels. In at least one embodiment, the testing apparatus and method may be designed to verify that memory components such as memory modules or memory devices can write and read stored data without error. In at least one other embodiment, the testing apparatus and method may be designed to verify that application specific integrated circuits (ASICs) will operate within specification.

Complete testing of memory components requires that each memory cell within the component can correctly store a high and a low digital value. However, as this functionality can be tested at low frequency, there is no frequency constraint generally imposed on the appropriate test vector to be used in that instance. Testing of this functionality is possible at low frequency by transmitting a test vector pattern containing all digital low values, on a first pass, followed by a test vector pattern containing all digital high values, on a second pass. The respective test vector patterns in each pass are constant values, which, according to Fourier theory, have no frequency content.

However, complete testing of memory components also generally requires that there be no fatal interaction between adjacent cells of memory, such as may arise from leakage capacitance. For example, the presence of a digital "1" in a cell adjacent to a digital "0" might have the effect of corrupting that digital "0" into a second digital "1". This type of functionality testing is typically carried out with test vector patterns that have high frequency content, for example by transmitting a test vector pattern consisting of alternating digital high and low values. In that instance, the test vector pattern equates to a square-wave pulse train.

Complete testing of ASICs, on the other hand, requires that the digital logic that implements the ASIC can transform input data into expected output data without error according to specification. This type of functionality testing potentially is also carried out with test vector patterns that have high frequency content because, in general, there are few, if any, limitations on the range of input data that the ASIC will be designed to handle.

Therefore, it is possible for the frequency content of the required test vector pattern, in certain instances, to fall outside of (e.g. above) the passband of the communication channel. Where that happens, testing of the integrated circuit device might not be properly performed using that high frequency test vector pattern, because it might not transmit along the communication channel without significant distortion. The described embodiments relate to a method and apparatus for generating test vector patterns that, in the case of memory components, adequately test for leakage effects in adjacent cells, while at the same time satisfying passband requirements imposed by the communication channel. The described embodiments also relate to a method and apparatus for generating test vector patterns that, in the case of ASICs, adequately test for implementation effects in data transformation, while at the same time satisfying passband requirements imposed by the communication channel.

Figure 1B:
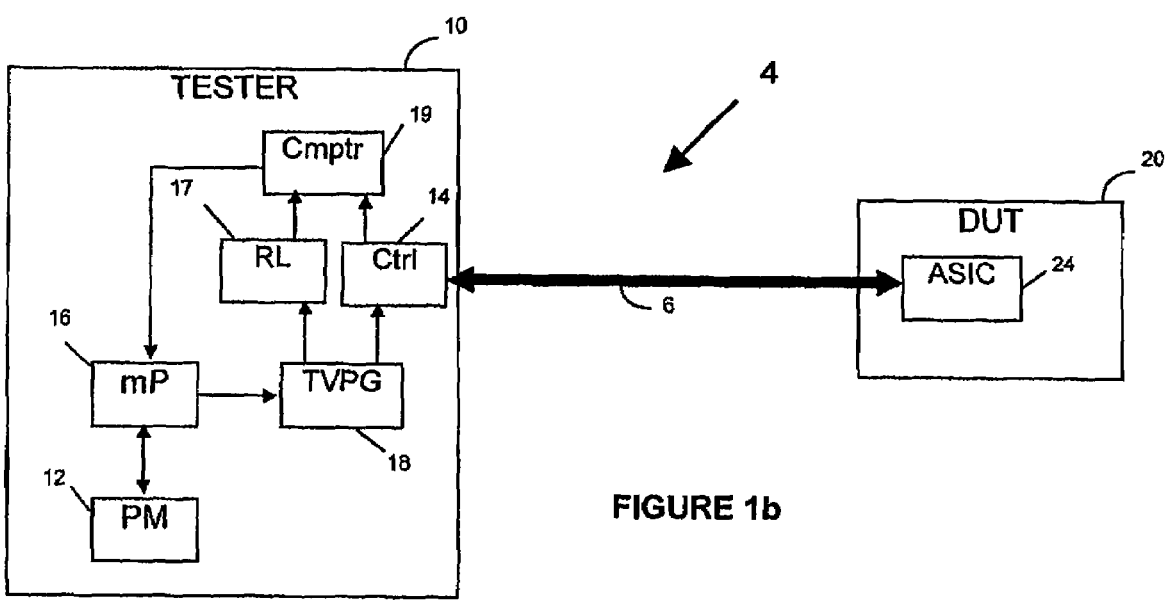
FIG. 1b is a block diagram of a testing system comprising an integrated circuit device under test and a tester module across a passband limited communication channel in at least one other embodiment.

Reference is now made to FIGS. 1a and 1b, in which test systems 2 and 4 for testing integrated circuit devices in the above-described manner are illustrated respectively. A tester 10 is coupled to the device under test (DUT) 20, which is or contains one or more integrated circuit devices under test, across a communication channel 6. The tester 10 interfaces with the device under test 20 in order to check the functionality of the integrated circuit device using generated test vector patterns.

The tester 10 comprises: a micro-processor 16, program memory 12, a test vector pattern generator (TVPG) 18, a controller 14, and a comparator 19. The tester module 10 also may comprise a reference memory module 15 (FIG. 1a), in the case where the device under test 20 is or contains one or more memory modules 22 or memory devices, or else it may comprise a reference logic module 17 (FIG. 1b), in the case where the device under test 20 is or contains one or more ASICs 24. Some electrical connections between the various components of the tester 10 are illustrated, by way of example, in FIGS. 1a and 1b. The basic operation of the tester 10 is described in the paragraphs below.

In performing the testing, the micro-processor 16 retrieves an instruction or instructions from the program memory 12. In response to that instruction, the micro-processor 16 instructs the TVPG 18 to generate a digital representation of a test vector pattern, which TVPG 18 then sends to the controller 14. The controller 14 is coupled externally to the communication channel 6 and, after receiving the test vector pattern generated by the TVPG 18, converts it to an electrical waveform, which controller 14 then outputs to the communication channel 6. The TVPG 18 also sends a digital representation of the test vector pattern to either the reference memory module 15 or the reference logic module 17, as the case may be, depending on the nature of the device under test 20, for use at a later stage in the present method. The passband limitations of communication channel 6 may be due to limitations on the transmitting and receiving circuitry, as well as the communication medium.

The test vector pattern outputted by the controller 14 is transmitted electrically across the communication channel 6 to the device under test 20 where it is sampled back into a digital form. At some point after transmission is complete, the controller 14 will receive back from the device under test 20 a second electrical signal transmitted across the communication channel 6, which controller 14 then samples back into a digital representation. The received signal depends on the nature of the device under test 20. But whether the device under test 20 comprises a memory module 22 or a memory device or else an ASIC 24, the controller 14 will expect to receive and then sample a particular waveform, the characteristics of which will depend on the nature of the device under test 20 and on the test vector pattern that was previously transmitted to it by the tester 10.

The tester 10 and the device under test 20 both operate on digital representations of test vector patterns. What is transmitted across the communication channel 6, however, is an electrical waveform that is representative of the test vector waveform. Conversion between the electrical and digital form of a test vector pattern occurs at the input/output ports of both the tester 10 and device under test 20. In the case of the tester 10 specifically, in this example embodiment, it is the controller 14 that performs the conversion. In the case of the device under test 20 specifically, an appropriate component or module thereon is configured to perform the conversion.

After the controller 14 receives an incoming electrical signal from the device under test 20 and converts it to a digital form, it relays that digital signal to the comparator 19 where it is compared with a digital form of a reference signal (i.e. a reference bit pattern, also generally referred to as an expected bit pattern), namely the signal that the controller 14 expects to receive from the device under test 20. That reference signal is transmitted to the comparator 19 by either the reference memory module 15 or the reference logic module 17, as the case may be depending on the nature of the device under test 20. The comparator 19 digitally determines whether or not the received signal identically matches the reference signal and outputs that logical determination to the micro-processor 16.

Ideally, the received signal will identically match the reference signal. Where the comparator 19 determines an identical match between the two compared signals, then the device under test 20 has, at least in the context of that particular test vector pattern, performed according to specification. But where the two signals compared are not identical, then the device under test 20 has undergone failure of some kind.

Where the device under test 20 is or contains one or more memory modules 22 or memory devices, as in the system 2 of FIG. 1*a*, then the reference signal is simply the digital representation of the test vector pattern as generated by the TVPG 18. The process of writing to and reading from a memory cell such as those found in the memory module 22 does not in general involve digital logic; therefore, there is no expectation of data transformation as part of the testing process. This fact is reflected in the functionality of the reference memory module 15. The digital test vector pattern sent to the comparator 19 from the reference memory module 15 is delayed until the controller 14 samples the returning waveform, the purpose of the delay being to align timing. The reference memory module 15 transmits the reference signal to the comparator 19 for comparison with the signal received and transmitted there by the controller 14.

On the other hand, where the device under test 20 is or contains one or more application-specific integrated circuits (ASICs) 24, as in the system 4 of FIG. 1*b*, then the reference signal is the logical output of the ASIC 24, given that test vector pattern as an input. The operation of an ASIC 24 does in general involve some form of digital logic; therefore, there is an expectation of data transformation as part of the testing process. This fact is reflected in the functionality of the reference logic module 17. The digital test vector pattern sent to the comparator 19 from the reference logic module 17 has been transformed according to the functionality of ASIC 24, and is delayed until the controller 14 samples the returning waveform. In other words, the reference logic module 17 simulates the ASIC 24 by transforming a particular input into the expected output and delays sending the reference signal to the comparator 19 for the purpose of time aligning. The reference logic module 17 transmits the reference signal to the comparator 19 for comparison with the signal received and transmitted there by the controller 14.

The device under test 20 can be any integrated circuit device or combination of integrated circuit devices including, but not limited to, memory modules, memory devices and/or ASICs.

In some embodiments, the device under test 20 comprises a memory component that consists in part of arrays of memory cells. For convenience, FIG. 1*a* shows a memory module 22 and the description of embodiments will refer primarily to memory modules. However, the described methods and systems can apply equally to other forms of memory devices.

Practical limitations on memory cells, such as those found in memory modules and memory devices, include, but are not limited to, leakage effects and charge decay. Leakage effects are the product of parasitic capacitance coupling one memory cell to adjacent memory cells. By way of this parasitic capacitance, it is possible for a digital value stored in one cell to be corrupted through leakage effects with adjacent cells. A second way that digital data can be corrupted is by charge decay, whereby a cell of memory gradually loses its stored charge through parasitic return paths to ground.

In some embodiments, the device under test 20 comprises an ASIC 24 designed to perform some function through digital electronic means. Practical limitations on high-speed functioning of ASICs include, but without restriction to the foregoing, jitter and gate transmission delay. Each of these limitations can result in malfunction of the ASIC in the sense of transforming a particular logical input into an output that is not predicted by the appropriate logical expression implemented by the ASIC 24.

The communication channel 6 may be any physical, communication channel that is passband limited. The passband on the communication channel 6 will typically comprise a high-frequency cutoff characteristic. The effective passband of the communication channel 6 will thus equal the cutoff frequency of the communication channel 6. In particular, if the communication channel 6 is to transmit the test vector pattern outputted by the tester 10 to the device under test 20 successfully, without loss or distortion that would result in a change in the value of the test vector pattern when received and digitized at the device under test 20, then the communication channel 6 must have a wide enough passband to accommodate the frequency content of the generated test vector pattern being transmitted.

Known methods of generating test vector patterns have resulted in high frequency test vector patterns that, if transmitted at full speed across the communication channel 6, contain frequency content falling above the cutoff frequency, and hence outside of the passband of the communication channel 6. In such cases, passband constraints may be overcome by decreasing the transmission rate of the test vector patterns.

Embodiments described herein for generating test vector patterns overcomes the passband constraint in a different manner. For example, in at least one embodiment, the test vectors themselves are generated according to patterns that inherently have less frequency content relative to than a high frequency test vector pattern that might otherwise have been used to test a device under test. By keeping the inherent frequency content of the test vector patterns within the passband of the communication channel 6 from the start, it is not necessary to reduce the transmission rate of the test vector patterns as a possible solution to the passband constraint.

In at least some applications, the ability to transmit the test vector patterns at full speed is desirable because it provides more rigorous and more complete testing of the device under test 20. Some critical device failures only occur when the device operates at full processing speed. Therefore, it is evident that testing of the device under test 20 will only successfully detect those failures if the testing can be performed at full processing speed.

Figure 2A:
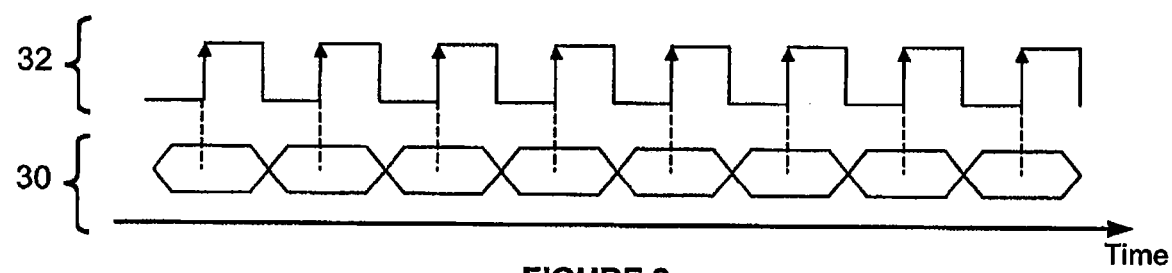
FIGS. 2a and 2b schematically illustrate the sampling of test vector patterns in response to edges of a clock signal.
Figure 2B:
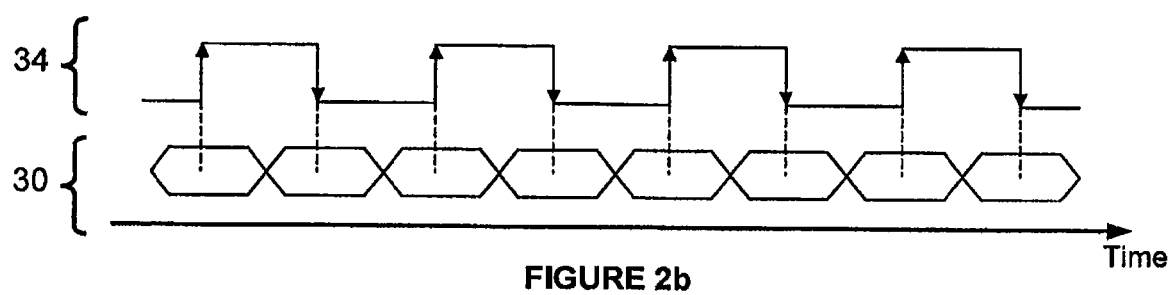

Reference is now made to FIGS. 2a and 2b, in which methods for sampling data waveforms by means of a sampling clock are illustrated. Test vector patterns transmitted electrically across a communication channel (e.g. communication channel 6 of FIGS. 1a and 1b) must at some point be sampled back into digital signals, sometimes by the device under test (e.g. device under test 20 of FIGS. 1a and 1b), sometimes by a controller in a tester (e.g. controller 14 in the tester 10 of FIGS. 1a and 1b).

There exists more than one possible approach to sampling data waveforms. Shown in FIG. 2a is one possible sampling signal 32 (sometimes referred to as a "single data rate" sampling signal), as may be used to sample arbitrary data waveform 30. The sampling signal 32 samples the value of the arbitrary data waveform 30 on all rising clock edges. Alternatively, though not shown, sampling could occur at all falling clock edges.

Shown in FIG. 2b is a second possible sampling signal 34 (sometimes referred to as a "double data rate" sampling signal), as may be used to sample the same arbitrary data waveform 30. The sampling signal 34 samples the value of the arbitrary data waveform 30 now on all rising as well as on all falling clock edges.

As depicted in the examples shown, both sampling signals 32, 34 sample the arbitrary data waveform 30 at the same rate, meaning the sampling events occur at equal intervals. However, as the double data rate sampling signal 34 samples twice per cycle, it has a frequency that is half that of the single data rate sampling signal 32, which only samples once per cycle. Making use of the double data rate sampling signal 34 is another means of easing the processing speed requirements imposed onto test systems and onto the functioning of a device under test.

Figure 3A:
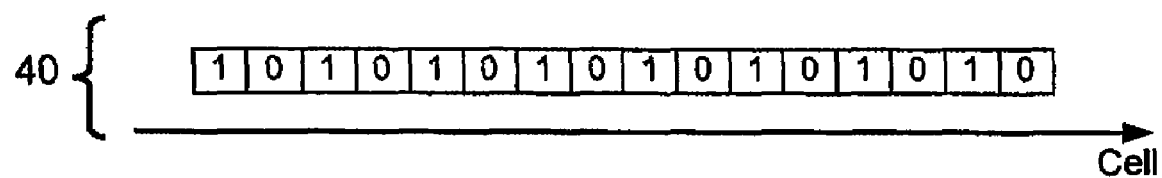
FIGS. 3a to 3c schematically illustrate one method for generating test vector patterns that addresses the passband limitation of communication channels.
Figure 3B:
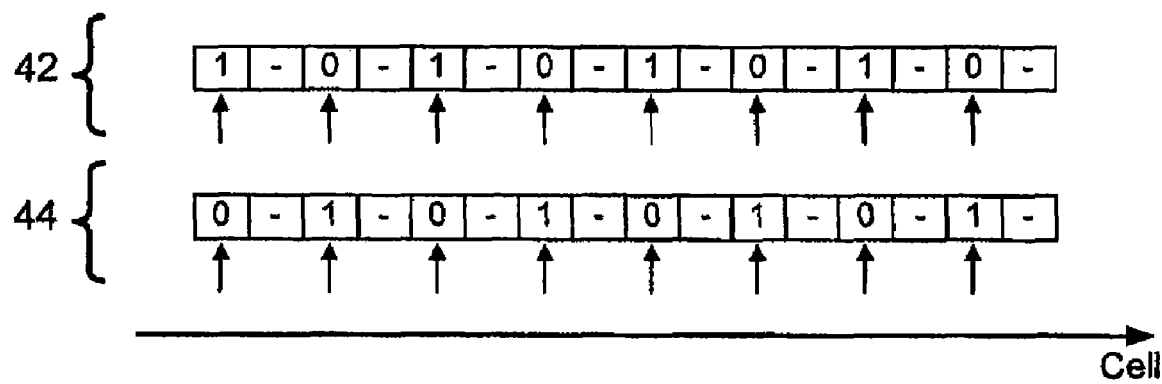
Figure 3C:
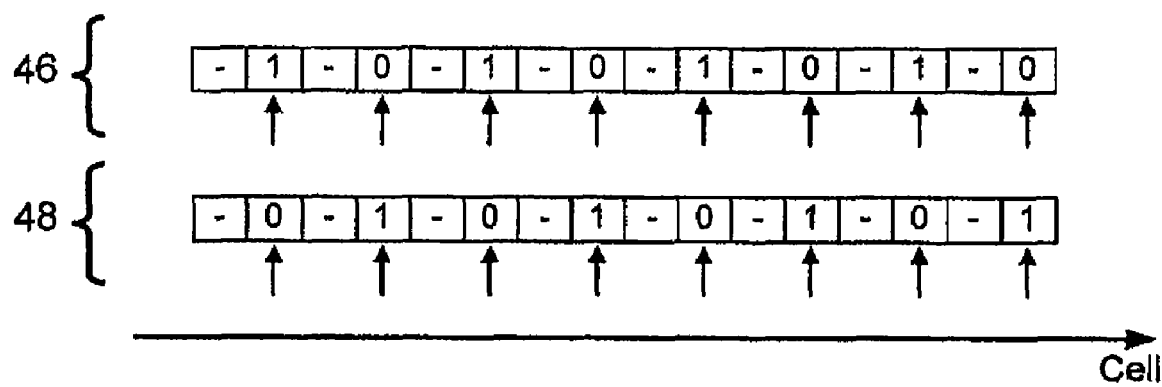

Reference is now made to FIGS. 3a to 3c, which are provided to illustrate a method for generating test vector patterns that overcome the passband constraint imposed on them by practical communication channels.

FIG. 3a shows a unique high frequency test vector pattern 40 that, for a given rate of transmission, may be considered to contain maximum frequency content. The example test vector pattern 40 shown in FIG. 3a is a square-wave pulse train that writes alternating high and low digital values to adjacent even and odd cell addresses when used as a test vector for a device under test that is or contains one or more memory modules (e.g. memory module 22 of FIG. 1a) or memory devices, for example. This example test vector pattern 40 is also referred to herein as a maximum frequency test vector pattern 40.

In addition to having the maximum frequency content, test vector pattern 40 depicted in FIG. 3a is generally a desirable test vector because it stresses a device under test (e.g. device under test 20 of FIGS. 1a and 1b). If the device under test 20 is, according to some embodiments, a memory module 22 or memory device, then the test vector pattern 40 of FIG. 3a is suitable for detecting device failure as a result of leaking capacitance effects. If the device under test 20 is, according to other embodiments, an ASIC (e.g. ASIC 24 of FIG. 1b), then the test vector pattern 40 of FIG. 3a may be similarly suitable for detecting application-specific device failure.

If the corresponding frequency content of the maximum frequency test vector pattern 40 falls within the passband of a communication channel (e.g. communication channel 6 of FIGS. 1a and 1b), then the device test is not constrained and so may utilize the maximum frequency test vector pattern 40 without modification.

However, if the corresponding frequency content of that test vector pattern 40 falls outside the passband of the communication channel 6, then that test vector pattern 40 must be substituted or otherwise modified in such a manner as to operate within passband constraints if accurate test results are to be attained.

For greater clarity, wherever reference is made to a given test vector pattern having a frequency content in the present specification, persons skilled in the art will understand that it is the frequency content of the test vector pattern when converted to an electrical signal for transmission over a communication channel at a given transmission rate that is being referred to, and not the frequency of the values changing in the digital pattern represented by the test vector pattern.

One might consider, for example, employing the test vector patterns shown in FIGS. 3b and 3c, where odd addressed cells and even addressed cells, respectively, are tested in isolated, multiple test passes. In particular, only cells with odd addresses might be tested in the first two passes and only cells with even addresses might be tested in the second two passes, or vice versa.

According to this example, a test vector pattern capable of writing alternating digital values to the nearest cells with odd address positions would first be generated. For example, in the test vector pattern 42 of FIG. 3b, a digital "1" would be written in cell 1, a digital "0" in cell 3, a digital "1" in cell 5, and so on. Digital data would then be retrieved from those cells with odd address positions. Upon comparison with the expected data, it could be determined if the device under test 20 was performing correctly to specification.

If the device under test 20 is a memory module 22, then the expected data would simply be the input data. On the other hand, if the device under test 20 is an ASIC 24, then the expected data would be the predicted output of the ASIC 24, given that particular input data, according to the logical expression that is implemented by the ASIC 24.

Secondly, the test vector pattern 42 from the previous pass would be inverted to generate test vector pattern 44. In the test vector pattern 44 of FIG. 3b, a digital "0" would be written in cell 1, a digital "1" in cell 3, a digital "0" in cell 5, and so on. Digital data would again and in like manner be retrieved from those cells with odd address positions and then compared with expected results.

Two more passes would be required to write to cells with even address positions. In other words, a test vector pattern capable of writing alternating digital values to the nearest cells with even address positions would be generated. For example, in the test vector pattern 46 of FIG. 3c, a digital "1" would be written in cell 2, a digital "0" in cell 4, a digital "1" in cell 6, and so on. Digital data would then be retrieved from those cells with even address positions. Upon comparison with the expected data, it could be determined if the device under test 20 was performing correctly to specification.

On a fourth and final pass, the test vector pattern 46 from the previous pass would be inverted. Continuing the example, in the test vector pattern 48 of FIG. 3c, a digital "0" would be written in cell 2, a digital "1" is cell 4, a digital "0" in cell 6, and so on. Digital data would again and in like manner be retrieved from those cells with even address positions and then compared with expected results.

A disadvantage of the test vector patterns described above with reference to FIGS. 3b and 3c is that they fail to adequately test contacts between adjacent cells with even and odd positions. In other words, employing these test vector patterns may not adequately test the practical effects of leakage capacitance because the method does not result in digital data being written to adjacent cells of memory. As contact testing is one aspect of testing memory components, employing these test vector patterns may not be completely satisfactory where comprehensive testing is desired.

The method employing the test vector patterns described with reference to FIGS. 3b and 3c also generally requires at least four separate read/write passes. Specifically, two are required for cells with even address positions and two are required for cells with odd address positions. In general, it is advantageous to minimize the number of required passes for considerations of time and efficiency.

Figure 4A:
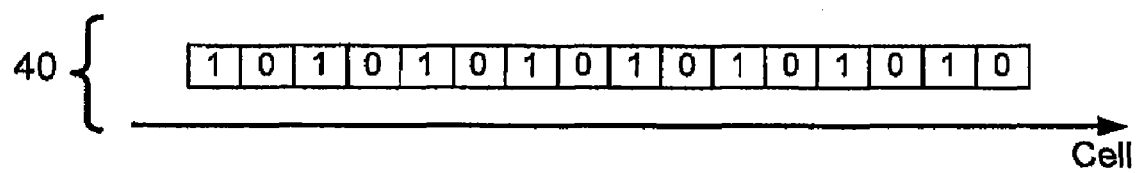
FIGS. 4a to 4c schematically illustrate a method for generating reduced frequency test vector patterns having twice reduced frequency content relative to a high frequency test vector pattern in accordance with one embodiment.
Figure 4B:
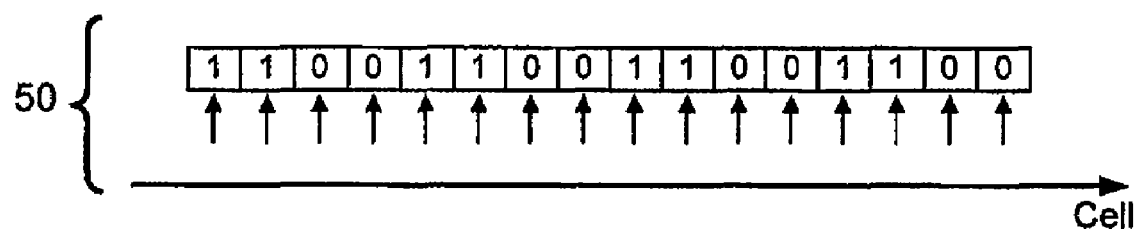
Figure 4C:
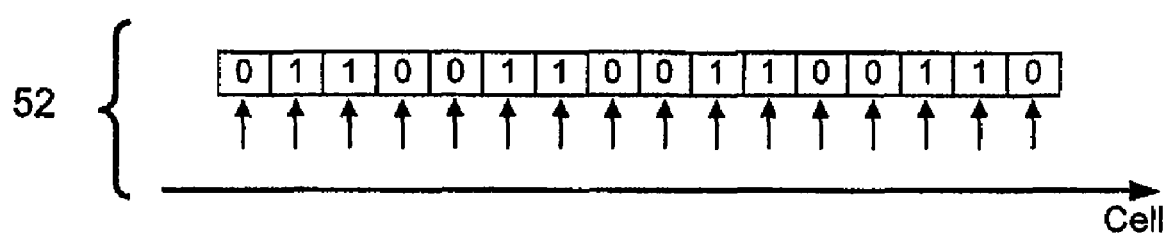

Reference is now made to FIGS. 4a to 4c, in which a method for generating test vector patterns that satisfy the passband constraint imposed on them by communication channels in accordance with one embodiment is illustrated. In particular, FIG. 4a shows the same maximum frequency test vector pattern 40 as in FIG. 3a that contains, for a given rate of transmission, maximum frequency content.

In accordance with one embodiment, as shown in FIG. 4b, a test vector pattern 50 for a reduced frequency square-wave pulse train that writes pairs of alternating high and low digital values to adjacent pairs of even and odd cells addresses is generated. With a period twice as long as that of the maximum frequency test vector pattern 40, the reduced frequency test vector pattern has half of the frequency content as the maximum frequency test vector pattern 40. Finally, shown in FIG. 4c is another reduced frequency test vector pattern 52, similar to test vector pattern 50, only now bit-shifted by one cell address relative to that test vector pattern 50.

According to this embodiment, where the passband limitations imposed by the communication channel would distort transmission of the maximum frequency test vector pattern 40 but would not distort transmission of reduced frequency test vector patterns 50 and 52, then the two reduced frequency test vector patterns 50 and 52 may alternatively be used to test the integrated circuit device (e.g. DUT 20 of FIGS. 1a and 1b).

In operation, a test vector pattern equivalent to the reduced frequency test vector pattern 50 is generated by a tester (e.g. tester 10 of FIGS. 1a and 1b). For example, with respect to the test vector pattern 50 of FIG. 4b, digital "1"s would be written in cells 1 and 2, digital "0"s in cells 3 and 4, digital "1"s in cells 5 and 6, and so on. Test vector pattern 50 is transmitted to the device under test 20 across a communication channel (e.g. communication channel 6 of FIGS. 1a and 1b). A controller (e.g. controller 14 of FIGS. 1a and 1b) would then retrieve stored digital data across the communication channel 6 via a "read" operation. Upon comparison (e.g. by comparator 19 of FIGS. 1a and 1b) with the expected bit pattern, a micro-processor (e.g. micro-processor 16 of FIGS. 1a and 1b) can digitally determine if the device under test 20 is performing correctly to specification in respect of that test vector pattern 50.

For a second pass, the tester 10 would repeat the above-described steps using the shifted reduced frequency test vector pattern 52. Continuing the example, with respect to the test vector pattern 52 of FIG. 4c, a digital "0" would be written in cell 1, digital "1"s in cells 2 and 3, digital "0"s in cells 4 and 5, digital "1"s in cells 6 and 7, and so on. Test vector pattern 52 is transmitted to the device under test 20 across the communication channel 6. The controller 14 would then retrieve stored digital data across the communication channel 6 via a "read" operation. Upon comparison (by comparator 19) with the expected data, the micro-processor 16 can digitally determine if the device under test 20 is performing correctly to specification in respect of test vector pattern 52.

It is expected that the reduced frequency test vector patterns described with reference to FIGS. 4b and 4c will more completely and comprehensively tests all memory cells in a memory module or memory device (e.g. memory module 22 of FIG. 1a) for contact leakage effects, as compared to the test vector patterns described with reference to FIGS. 3b and 3c. In particular, the choice of test vector patterns of FIGS. 4b and 4c employed in each of two passes respectively ensures that, for any given pair of adjacent cells, in either the first or the second pass, opposite digital values are written to the two cells of memory comprising the pairing.

For example, assume the reduced frequency test vector pattern 50 is applied in the first pass, and the shifted reduced frequency test vector pattern 52 is applied in the second pass. Cell pairings 1 and 2 had opposite digital values written in the second pass, cell pairings 2 and 3 had opposite digital values written in the first pass, cell pairings 3 and 4 had opposite digital values written in the second pass, and so on. Stated otherwise, on the first pass, connections between cell pairings 2 and 3, 4 and 5, 6 and 7, and so on, are tested for leakage effects, and on the second pass, connections between cell pairings 1 and 2, 3 and 4, 5 and 6, and so on, are likewise tested.

Whether the reduced frequency test vector pattern has been shifted one cell address to the right, as shown in FIG. 4c, or one cell address to the left (not explicitly shown) will not generally affect the testing results. Choice of either a right-shifted test vector pattern 52 or a left-shifted test vector pattern will equally result in every pair of cells in the memory module 22 or memory device being tested for contact leakage after the requisite number of passes is made.

It must also be noted that, although the above-described embodiment utilizes reduced frequency test vector patterns 50, 52, each having a period that is twice the period of the maximum frequency test vector pattern 40, other embodiments are not limited to employing that single choice of reduced frequency test vector patterns. In fact, the above-described embodiment may be generalized to make use of a reduced frequency test vector having a period that is larger than that of the maximum frequency test vector pattern 40 by an integer factor of, say, three, four, five or more.

Figure 5A:
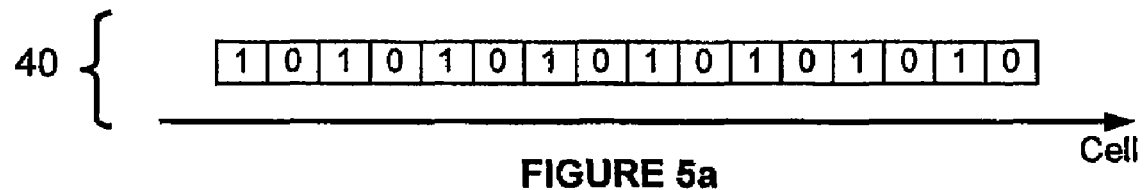
FIGS. 5a to 5d schematically illustrate a method for generating reduced frequency test vector patterns having three times reduced frequency content relative to a high frequency test vector pattern in accordance with another embodiment.
Figure 5B:
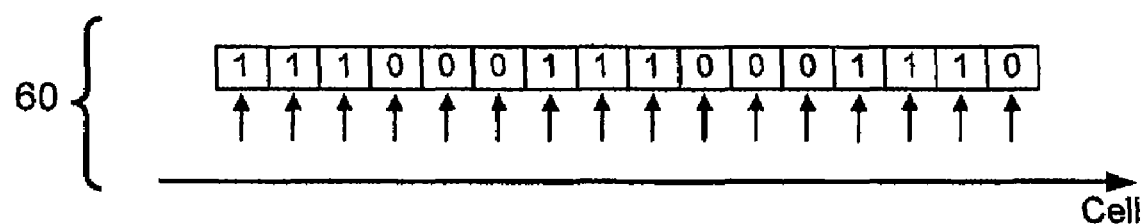
Figure 5C:
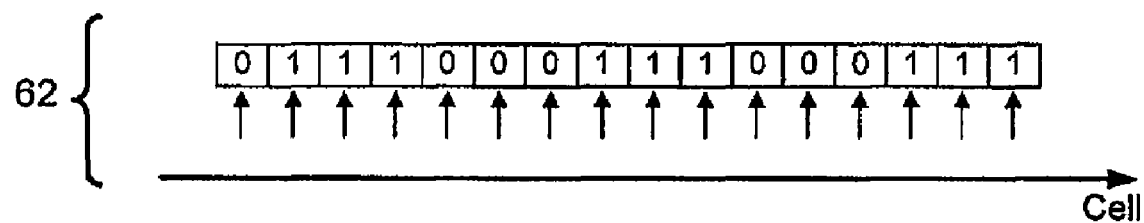
Figure 5D:
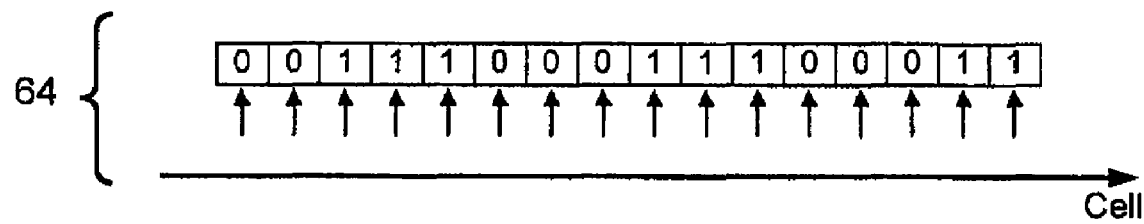

For example, reference is now made to FIGS. 5a to 5d, in which a method for generating reduced frequency test vector patterns relative to a high frequency test vector pattern in another embodiment is illustrated. In particular, frequency reduction has occurred by a factor of three relative to the maximum frequency test vector pattern 40. Frequency reduction of that amount is achieved, according to the inverse relationship between frequency and period, simply by increasing the period of the base test vector pattern by the proper amount, in other words by a factor of three in this example. Shown in FIG. 5b is a three-times reduced frequency test vector pattern 60; shown in FIG. 5c is a one bit shifted (relative to test vector pattern 60), three-times reduced frequency test vector pattern 62; and shown in FIG. 5d is a two bit shifted (relative to test vector pattern 60), three-times reduced frequency test vector pattern 64.

Where the passband limitations imposed by a communication channel would distort transmission of the maximum frequency test vector pattern 40 but would not distort transmission of reduced frequency test vector patterns 60, 62 and 64, then the three reduced frequency test vector patterns 60, 62, 64 may alternatively be utilized in order to test the device under test 20.

In operation, the tester 10 would sequentially generate the three test vector patterns 60, 62, and 64 using micro-processor 16 and the TVPG 18; transmit the corresponding test vector pattern waveforms to the device under test 20 across the communication channel 6, receive and digitize bit pattern signals returned from the device under test 20 across the communication channel 6, and finally compare the received bit pattern with a reference (i.e. expected) bit pattern. Upon comparison by comparator 19, the micro-processor 16 can determine if the device under test 20 is performing correctly to specification in respect of those test vector patterns 60, 62, and 64, respectively. The tester 10 follows the above-described steps at least once for each of the three required passes corresponding to test vector patterns 60, 62, and 64.

As in the embodiment that utilizes two times reduced frequency test vector patterns 50, 52, this embodiment that utilizes three times reduced frequency test vector patterns 60, 62, and 64 also tests the device under test 20, which is or contains one or more memory modules 22 or memory devices, for contact leakage effects. In particular, for any given pair of adjacent cells, in any one of the three passes, opposite digital values are written to the two cells of memory comprising the pairing.

For example, assume that the reduced frequency test vector pattern 60 is applied in the first pass, the one bit shifted reduced frequency test vector pattern 62 is applied in the second pass, and the two bit shifted reduced frequency test vector pattern 64 is applied in the third pass. On the first pass, connections between cell pairings 3 and 4, 6 and 7, 9 and 10, and so on, are tested for leakage effects, and on the second pass, connections between cell pairings 1 and 2, 4 and 5, 7 and 8, and so on, are likewise tested, and finally on the third pass, connections between cell pairings 2 and 3, 5 and 6, 8 and 9, and so on, are likewise tested. In this manner, after the completion of the three passes, each pairing of adjacent memory cells is tested for possible leakage effects.

The embodiments described with reference to FIGS. 4b to 4c, and FIGS. 5b to 5d, utilize test vector patterns that are balanced pulse trains, meaning that they comprise alternating groupings of digital high and low values that are equal in number with respect to each other. In vector patterns 50, 52 of FIGS. 4b and 4c, each grouping consists of two digital values; in vector patterns 60, 62, 64 of FIGS. 5b to 5d, each grouping consists of three digital values. Other embodiments, however, may employ test vector patterns of a different type.

More generally a set of test vector patterns that satisfies the following requirements imposed on the test system 2 may be employed in variant embodiments in which a memory module 22 or memory device is to be tested. Each of the test vector patterns has reduced frequency content at a given transmission rate across a particular communication channel, relative to a high frequency test vector pattern (such as, but not limited to, maximum frequency test vector pattern 40). If the high frequency test vector pattern were to be transmitted electrically at the same transmission rate using the same communication channel, the frequency content of the high frequency test vector pattern would fall outside of the passband associated with the communication channel, making the high frequency test vector pattern unsuitable for testing purposes. The frequency content of the test vector pattern falls within the passband imposed by the communication channel. The set of test vector patterns used for the testing also comprise a finite number of test vector patterns (e.g. a series of shifted versions of a first test vector pattern).

Persons of ordinary skill in the art will understand that when a test vector pattern is defined, in the description and in the claims, as having a frequency content that falls within a passband of a communication channel, this does not imply that the test vector pattern has no frequency content whatsoever falling outside of the passband of the communication channel 6. It will be understood that periodic signals generally have infinite frequency content. Rather, the frequency content of a test vector pattern when transmitted across a communication channel at a given transmission rate will be deemed to fall within the passband of the communication channel when the frequency content is sufficient to enable the electrical signal of the received test vector to be sampled back into the identical bit pattern associated with the transmitted test vector (i.e. the digital value is unchanged after transmission). Conversely, the frequency content of a test vector pattern when transmitted across the communication channel at a given transmission rate will be deemed to fall outside of the passband of the communication when the frequency content is not sufficient to enable the electrical signal of the received test vector to be sampled back into the identical bit pattern associated with the transmitted test vector (i.e. the digital value is changed after transmission).

In at least one embodiment, the finite set of test vector patterns is generated such that in use, the set of test vector patterns, collectively, is capable of testing the device under test for, at a minimum, the same errors that the high frequency test vector pattern would otherwise have been capable of testing the device under test for, if the high frequency test vector pattern were considered suitable for use (i.e. if its use were not been restricted by the passband constraints of the given communication channel). Accordingly, the same errors can be tested for using the lower frequency test vector patterns, rather than a high frequency test vector pattern that is considered unsuitable for testing purposes. In one embodiment, the error(s) tested by any one test vector pattern of the set of generated test vector patterns differs from the error(s) tested by any other test vector pattern of the set of generated test vector patterns.

In one embodiment, the set of test vector patterns used will test every pairing of adjacent cell addresses for contact effects in memory module 22 or memory device.

In variant embodiments, test vector patterns that are unbalanced pulse trains may be utilized, where the test vector patterns comprise alternating groupings of digital high and low values that are not equal in number of bits with respect to each other. For example, a suitable unbalanced test vector pattern may comprise alternating groupings of three digital high values and two digital low values. Another example is the inverse of that vector pattern comprising alternating groupings of two digital high values and three digital low values. Balanced and unbalanced test vector patterns sharing the same period do not in general have the same frequency content, though both are reduced as compared to the maximum frequency test vector pattern 40. The exact frequency distribution can be calculated by solving the particular Fourier series associated with the test vector pattern. Moreover, balanced and unbalanced test vector patterns sharing the same period do not in general require the same number of passes for complete testing of contact effects, though both require only a finite number. In order to fully test for leakage and other corrupting effects between adjacent memory cells, the minimum number of required passes should equal the maximum number of consecutive like digital values, either high or low, found in the test vector pattern.

Pulse trains, whether balanced or unbalanced, as those terms are used above, are suitable test vector patterns for testing memory components, but they are not the only suitable test vector patterns. In some embodiments, therefore, each test vector pattern is any test vector pattern that is periodic, having P bits and at least one low-to-high or high-to-low transition per period, and that further satisfies a number of requirements. In one example embodiment, first, the test vector pattern, when transmitted (e.g. at full processing speed) across the communication channel 6, has frequency content that falls within that channel's passband. Second, a finite set of bit shifted versions of a first test vector pattern will, when input sequentially to the device under test 20, test at least the same errors as a high frequency test vector pattern (e.g. maximum frequency test vector pattern 40) would be capable of testing. In one example, the set of test vector patterns will, in aggregate, test all cell contacts in a memory module for leakage effects. In terms of the first requirement, the frequency content of the test vector pattern is determinable by solving the Fourier series of the waveform. In terms of the second requirement, if the test vector pattern has P bits per period, then P passes of bit shifted versions of the test vector pattern will be satisfactory, though fewer passes may also be satisfactory. In particular, the minimum number of required passes for complete contact testing will equal the maximum number of consecutive like bits, either high or low values, in the test vector pattern.

Utilization of test vector patterns that, as described above, are periodic in nature can provide an efficient and reliable means for the present method to exhaustively test every pairing of adjacent memory cells for possible leakage effects. However, it is not necessary for any or all of the test vector patterns to be periodic in nature, nor for any or all but one of them to be shifted versions of a test vector pattern that serves as a basis for the shifted versions.

Therefore, in variant embodiments, the present method can utilize a set of other test vector patterns {M1, M2, M3, . . . } that satisfy the requirements that may be imposed on the test system 2 as described above. For example, nearly periodic or aperiodic test vector patterns may be employed, which may or may not be perfectly shifted versions of a given test vector pattern. As the term is used here, a test vector pattern that is nearly periodic is one that would have been periodic if not for one or more data bits having been corrupted relative to that periodic test vector pattern. In a similar fashion, a test vector pattern may be considered a nearly shifted version of a particular test vector pattern if it would have been a perfectly shifted version were it not for one or more bits of data having been corrupted relative to that perfectly shifted version. Where utilization of perfectly shifted versions of a particular test vector pattern might result in a minimal number of overall passes being required, using test vector patterns that are nearly shifted versions of the particular test vector might require more than a minimal number of overall passes. Generating a set of test vector patterns that requires a minimal number of passes for exhaustive testing is desirable because it promotes efficiency, but this is not an essential requirement.

As a further example, the set of test vector patterns {M1, M2, M3, . . . } employed may appear to be arbitrarily chosen. The set of test vector patterns may not necessarily involve one or more perfectly shifted or nearly shifted versions of a particular test vector pattern. For example, the set {[111100], [011000], [001110]}, where each element of the set represents the period of a periodic test vector pattern, appears to be a set of generally uncorrelated test vector patterns. The set is generally uncorrelated in the sense that no single relationship, such as bit shifting, explains the bit sequences that comprise all three test vector patterns in the set. Nevertheless, each test vector pattern has a reduced frequency content, relative to a high frequency test vector such as the maximum frequency test vector pattern 40. The set of test vector patterns, if input sequentially to the device under test 20, may be used to exhaustively test the device under test 20 for contact leakage effects, where the DUT 20 is a memory module 22. However, although the set {[111100], [011000], [001110]} may repre-sents a suitable alternative to a set of shifted reduced frequency vector patterns, such as {[1100], [0110]} for example (e.g. see FIGS. 4b and 4c), it would generally not be considered to be an optimal set, in terms of time and efficiency. In particular, for exhaustive testing of the device under test 20, the set {[111100], [011000], [001110]} will generally require three sequential passes, while the set {[1100], [0110]} will generally require only two sequential passes.

Suitable test vector patterns for comprehensive testing of contact effects in memory components, such as memory module 22 of FIG. 1a, may not be necessarily suitable test vector patterns for comprehensive testing of other integrated circuit devices, such as ASIC 24 of FIG. 1b. The circumstances under which an ASIC will fail, in general, differ from those under which a memory component will fail. This fact is reflected in the differing suitability of test vector patterns used to perform device testing for those two types of integrated circuit devices.

With reference to FIG. 1b, in some embodiments, therefore, the test vector pattern generated by TVPG 18 in tester 10 is a test vector pattern suitable for testing ASIC 24. Testing of ASIC 24 is functional in the sense that an objective of the test is to determine whether the ASIC 24 will perform as designed. More specifically, an objective of testing is to determine whether, for a particular input test vector pattern T, the ASIC 24 will return the expected bit pattern as output (which will depend on the logic embodied in ASIC 24 and accordingly, will not generally equal T). For example, test vector pattern T may be a non-repeating bit sequence comprising groupings of alternating high and low bits that increase in number, i.e. "11 00 111 000 1111 0000 . . . ". Test vector pattern T may also be any pattern of bits that is arbitrarily selected to perform function or application-specific testing of the ASIC 24. The pattern that would be required for a given test, however, will typically depend on the behavioral failure that the application-specific test is designed to detect.

In any event, when the desired input test vector pattern T is a high frequency test vector pattern and therefore does not satisfy the passband requirement imposed by the communication channel 6, T will not be a suitable test vector pattern for functional testing of ASIC 24.

Furthermore, input test vector pattern T will not be a suitable test vector pattern when the output bit pattern of the ASIC 24 that is returned to the tester over the communication channel 6, given an input equal to input test vector pattern T, does not satisfy the passband requirement imposed by the communication channel 6.

In order to address the passband requirement in respect of ASIC testing, in accordance with at least one embodiment, a set of test vector patterns {T1, T2, T3, . . . } can be generated that, in effect, simulates the testing capability of test vector pattern T. The set of test vector patterns {T1, T2, T3, . . . } satisfies a number of requirements imposed on the test system 4. The test vector patterns {T1, T2, T3, . . . }, when transmitted electrically (e.g. at full processing speed) at a given transmission rate across the communication channel 6, each individually has a frequency content that is reduced relative to a high frequency test vector pattern (in this case, test vector pattern T), and falls within that channel's passband. This is in contrast to the frequency content of test vector pattern T, which would fall outside of the channel's passband if the high frequency test vector pattern were to be transmitted electrically at the same transmission rate using the same communication channel, In addition, test vector patterns {T1, T2, T3, . . . } are also chosen so that the expected output of ASIC 24 also satisfies the passband requirements of communication channel 6. Furthermore, the test vector patterns used for the testing comprise a finite number of test vector patterns.

In at least one embodiment, the test vector patterns {T1, T2, T3 . . . } will test the ASIC 24 in a manner at least equivalent to what would have resulted had ASIC 24 been tested with a high frequency test vector pattern, namely test vector pattern T in this example. More specifically, the finite set of test vector patterns is generated such that in use, the set of test vector patterns, collectively, is capable of testing the ASIC 24 for, at a minimum, the same errors that test vector pattern T would otherwise have been capable of testing the ASIC 24 for, if the test vector pattern T were considered suitable for use (i.e. if its use were not been restricted by the passband constraints of the given communication channel). Accordingly, the same errors can be tested for using the lower frequency test vector patterns, rather than a high frequency test vector pattern that is considered unsuitable for testing purposes. In one embodiment, the error(s) tested by any one test vector pattern of the set of test vector patterns {T1, T2, T3 . . . } differs from the error(s) tested by any other test vector pattern of the set of test vector patterns {T1, T2, T3 . . . }.

As it is expected that when the individual test vector patterns {T1, T2, T3 . . . } each has a frequency content that falls within the passband of a communication channel when transmitted thereon, but the frequency content of the test vector pattern T would not fall within the passband of the communication channel if the test vector pattern T were to be transmitted thereon, the use of the individual test vector patterns will generally provide more accurate test results.

Figure 6:
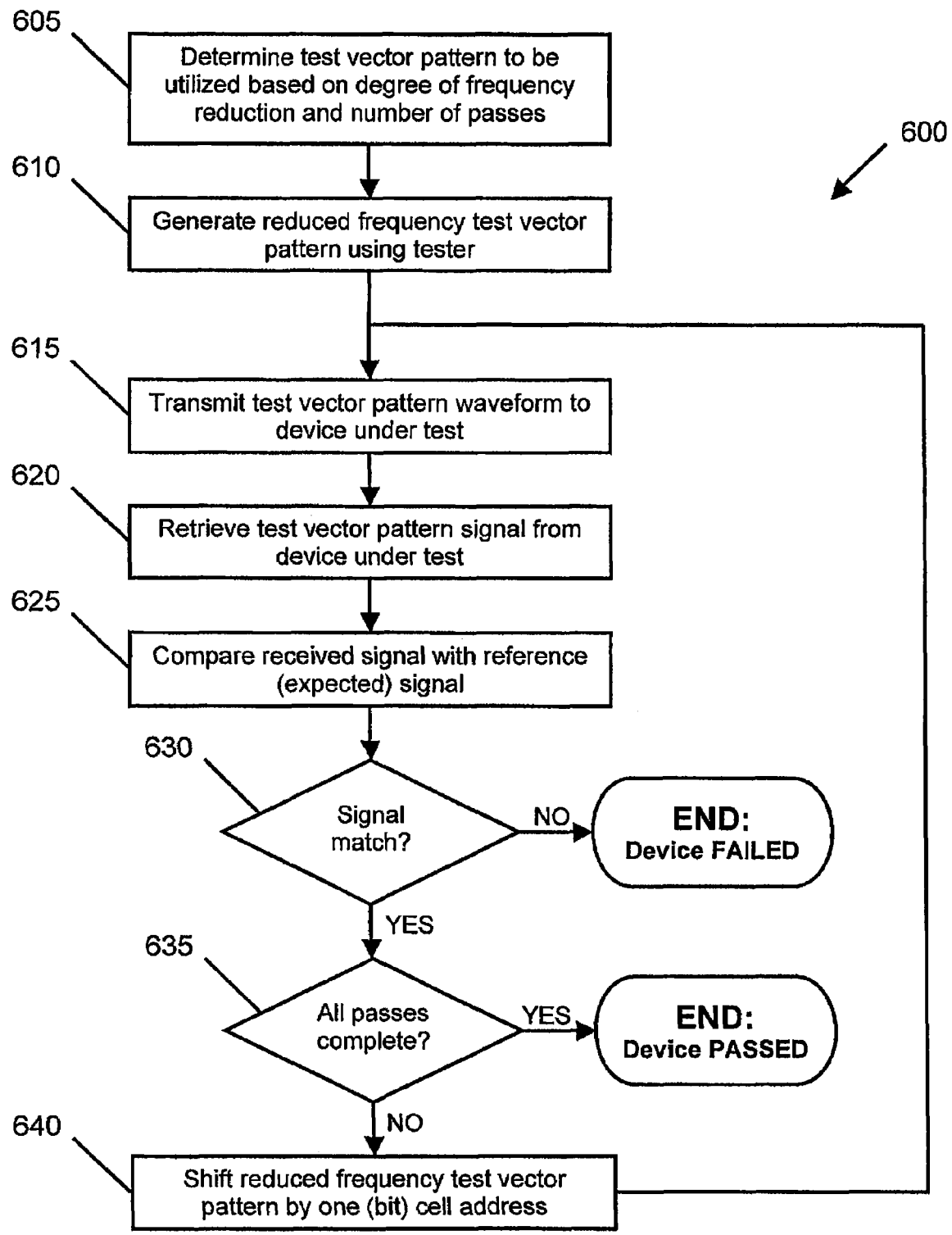
FIG. 6 is a flowchart of a method of testing a DUT using test vector patterns generated in accordance with at least one embodiment.

Reference is now made to FIG. 6, in which a procedural method 600 of testing a DUT 20 (FIG. 1a), where the DUT 20 comprises a memory module 22 (FIG. 1a) in at least one embodiment, is illustrated. Some details of method 600 may have been previously described in the present description.

The present embodiment is not limited in the amount of frequency reduction, relative to the a high frequency test vector pattern such as maximum frequency test vector pattern 40, of the desired reduced frequency test vector patterns, so long as the frequency content of each test vector pattern being transmitted over a communication channel falls within the passband imposed by the communication channel.

In general, the method 600 of FIG. 6 can be adopted in order to generate a set of suitable test vector patterns that involve shifted versions of a particular first test vector pattern. For example, the method 600 can be adopted to generate test vector patterns that are balanced pulse trains, as described above, having a base frequency that is N times less than that of the maximum frequency test vector pattern 40 (e.g. FIGS. 4a, 5a), where N is an integer. As described above in relation to FIGS. 4b and 4c, and FIGS. 5b to 5d, N is 2 and 3, respectively. The method 600 can also be adopted in order to generate test vector patterns that are unbalanced pulse trains, as described above, having a base frequency that is (R+S)/2 times less than that of the maximum frequency test vector pattern 40, where R and S are both integers and correspond to the number of bits in the alternating groupings of digital high and low values, respectively, for example. The method 600 can also be adopted in order to generate test vector patterns that are any periodic waveform, as described above, having P bits and at least one low-to-high or high-to-low transition per period. Different test vector patterns may be generated in variant embodiments.

Step 605 comprises determining or allocating the appropriate test vector patterns based on, for example, the required degree of frequency reduction, the desired number of passes, or possibly both. The appropriate amount of frequency reduction depends on the passband of the communication channel 6 (FIG. 1a) and the processing speed of the device under test 20. At a minimum, the frequency content of the test vector pattern must be reduced to be within the passband of the communication channel 6. How much frequency reduction is to be achieved and how it is to be achieved, whether through utilization of a balanced pulse-train, an unbalanced pulse-train or general periodic test vector patterns, is determined. However, the desired number of passes can constrain the pool of available test vector patterns. If only a certain limited number of passes are desired, then certain test vector patterns may only be suitable to the extent that the maximum number of consecutive like bit values in the waveform does not exceed the limited number of passes as fixed in the method 600.

If unbalance is introduced to the pulse-train serving as a test vector pattern, the degree of unbalance is also determined. If a general periodic signal is preferred as a test vector pattern, then the particular bit sequence that is repeated periodically is determined. It will be understood that the determination of suitable test vector patterns may, in general, yield more than one suitable vector pattern.

Step 610 comprises generating a reduced frequency test vector pattern, based either on the value N, the values R and S, or the value P, as determined and allocated in the previous step 605. In some embodiments, the vector pattern is a balanced pulse-train and consists of alternating groupings (a grouping is also referred to herein in the description and in the claims as a bit plurality) of N cell addresses each having digital high or low values. This test vector pattern, for example, can begin at cell 1 with the first grouping of N digital high values, followed by the first grouping of N digital low values beginning at cell N+1 and repeated thereafter.

In other embodiments, the vector pattern is an unbalanced pulse-train and consists of alternating groupings (bit pluralities) of R cell addresses having either digital high or low values followed by S cell addresses having inverted digital values relative to the previous group of R cell addresses. This test vector pattern, for example, can begin at cell 1 with the first grouping of R digital high values followed by the first grouping of S digital low values beginning at cell R+1 and repeated thereafter.

In still other embodiments, the vector pattern is a general periodic waveform and consists of a repeated sequence of bit pluralities, where each bit plurality in the repeated sequence consists of P bits and contains at least one high-to-low or low-to-high bit transition. This test vector pattern, for example, can begin at cell 1 with the first bit plurality of length P followed by a second identical bit plurality beginning at cell P+1 and repeated thereafter. Potentially other test vector patterns of different configurations are also suitable for the present method 600.

In one embodiment, step 610 is executed by the tester 10 shown in FIG. 1a. In particular, the TVPG 18 (FIG. 1a) generates the test vector pattern in response to an instruction fetched from process memory 12 (FIG. 1a) by a micro-processor 16 (FIG. 1a) and relayed thereto.

Step 615 comprises transmitting a test vector pattern waveform, corresponding to the test vector pattern generated in the previous step 610, to the device under test 20 across the communication channel 6. Step 615 is executed by the tester module 10 shown in FIG. 1a. In particular, the TVPG 18 transmits the generated test vector pattern to the controller 14, where it is converted into an electrical waveform and outputted to the communication channel 6.

Step 620 comprises receiving a bit pattern waveform, corresponding to the digital signal produced by the device under test 20, returned from the device under test 20 across the communication channel 6 in response to the test vector pattern waveform transmitted at step 615. Step 620 is executed by the test module 10 shown in FIG. 1*a*. In particular, the controller 14 samples the electrical waveform received from the communication channel 6.

Step 625 comprises comparing the received bit pattern with a reference (i.e. expected) bit pattern. Where the device under test 20 is a memory module 22, the reference bit pattern is the digital representation of the bit pattern of the generated test vector pattern waveform. Step 625 is executed by the test module 10 shown in FIG. 1*a*. In particular, the controller 14 sends the sampled incoming waveform as a bit pattern to the comparator 19, where it is compared with the reference bit pattern transmitted thereto by the reference memory module 15.

In some embodiments, if the comparison in step 625 produces a digital mismatch, then decision 630 results in the micro-processor 16 determining from the output of comparator 19 that the device under test 20 has failed, and the nature of the failure is recorded, and output if desired. In this example, method 600 ends upon determination of an error. If, however, the comparison produces a digital match, then decision 630 results in the method continuing to the extent that more passes are required. In other words, if every pass has so far produced a digital match and no more passes are scheduled, then decision 635 that ensues also results in the method ending, this time for reason that the device under test 20 has passed the testing successfully. If, however, more passes are required, then decision 635 results in the method continuing to step 640 and then repeating steps 615 through 635 until all passes are successfully completed or until the device under test 20 fails a pass before that can happen.

In a variant embodiment, all scheduled test passes will be performed regardless of whether one or more individual passes results in failure of the device under test 20. One reason to complete all scheduled passes after a failure is to determine all the possible locations of device failures. In such embodiments, decision 630 will always result in the method continuing to the extent that more passes are required (e.g. flow of method steps proceeds to step 635, not shown in FIG. 6). If the comparison in step 625 produces a digital mismatch, then the nature of the one or more failures, as determined by the micro-processor 16 from the output of comparator 19, is noted and recorded, and output if desired. If the comparison performed at step 625 produces a digital match, then the method simply continues. Regardless of how many failures are noted and recorded, if more passes are scheduled, then decision 635 results in the method continuing to step 640 and then repeating steps 615 through 635 until all passes are completed. If no more passes are scheduled, then decision 635 results in the method ending. Whether or not the device is considered to have passed the testing successfully depends on whether or not any failures were noted and recorded.

In total, the number of required passes depends on the particular test vector pattern utilized. For example, if the test vector pattern is a balanced pulse train, then N passes will be required for comprehensive testing of the device under test, comprising: one pass for a reduced frequency test vector pattern that can serve as a first test vector, for example test vector pattern 60 in FIG. 5*b*; and N−1 passes for test vector patterns that are shifted by one or more bits, relative to the chosen first test vector pattern. For example, the first test vector pattern may be shifted to generate other test vector patterns by increasing increments of one cell address, as shown in the example test vector patterns 62, 64 in FIGS. 5*c* and 5*d*.

If the test vector pattern is an unbalanced pulse train, then the larger of R or S passes will be required for comprehensive testing of the device under test, similar to above, comprising: one pass for a reduced frequency test vector pattern that can serve as a first test vector pattern; and the greater of R−1 or S−1 passes, as the case may be, for test vector patterns that are shifted by one or more bits, relative to the first test vector pattern. For example, the first test vector pattern may be shifted to generate other test vector patterns by increasing increments of one cell address.

If the test vector pattern is a general periodic signal, then at most, but potentially fewer than, P passes will be required for comprehensive testing of the device under test, similar to above, comprising: one pass for a reduced frequency test vector pattern that can serve as a first test vector pattern; and P−1 passes, as the case may be, for test vector patterns that are shifted by one or more bits, relative to the first test vector pattern. For example, the first test vector pattern may be shifted to generate other test vector patterns by increasing increments of one cell address. As described above, where a general periodic test vector waveform is used, the minimum number of required passes corresponds to the maximum number of consecutive like-bits in the waveform.

Having established at step 635 that more passes are required, step 640 comprises shifting the reduced frequency test vector pattern, in this example, by one cell address. Shifting may occur either to the right or to the left, but throughout the method, must remain consistent. Once shifted, in order to complete the pass in respect of the shifted test vector pattern generated in this step 640, the flow of method steps proceeds back to repeat step 615, step 620 and step 625 as they are described above. Step 640 is executed by the test module 10 shown in FIG. 1*a*. In particular, the TVPG 18 can coordinate with the micro-processor 16 to generate the required shifted test vector pattern for a given pass.

Pursuant to the appropriate instruction from micro-processor 16, the shifted test vector pattern may be generated by the TVPG 18 in different ways. For example, the TVPG 18 might shift the previously generated test vector pattern by one cell increment, or possibly by more than one cell increment in variant embodiments. It might alternatively shift the test vector pattern that serves as the first test vector pattern by an appropriate number of cell increments. It might alternatively generate a test vector pattern, independent of what it has previously generated, that is an appropriately shifted test vector pattern. Although method 600 of FIG. 6, in one example, generates shifted test vector patterns by way of an incremental one-bit shift, the ways to accomplish the shift are not limited, and other ways of generating multiple test vector patterns are possible in variant embodiments.

The above-described method 600 will result in improved testing of contact leakage in the device under test 20, relative to the method described in relation to FIGS. 3*a* to 3*c*. In particular, method 600 will result in each group of adjacent cells being written with opposite digital values, the effect of which may be to reveal a possible defect in the memory module 22 or other memory component that might lead to failure as a result of contact leakage.

The appropriate degree of frequency reduction, moreover, is a design consideration that may be determined as in the first step 605 of the method. At a minimum, frequency reduction must satisfy the passband constraint imposed by the communication channel.

Figure 7:
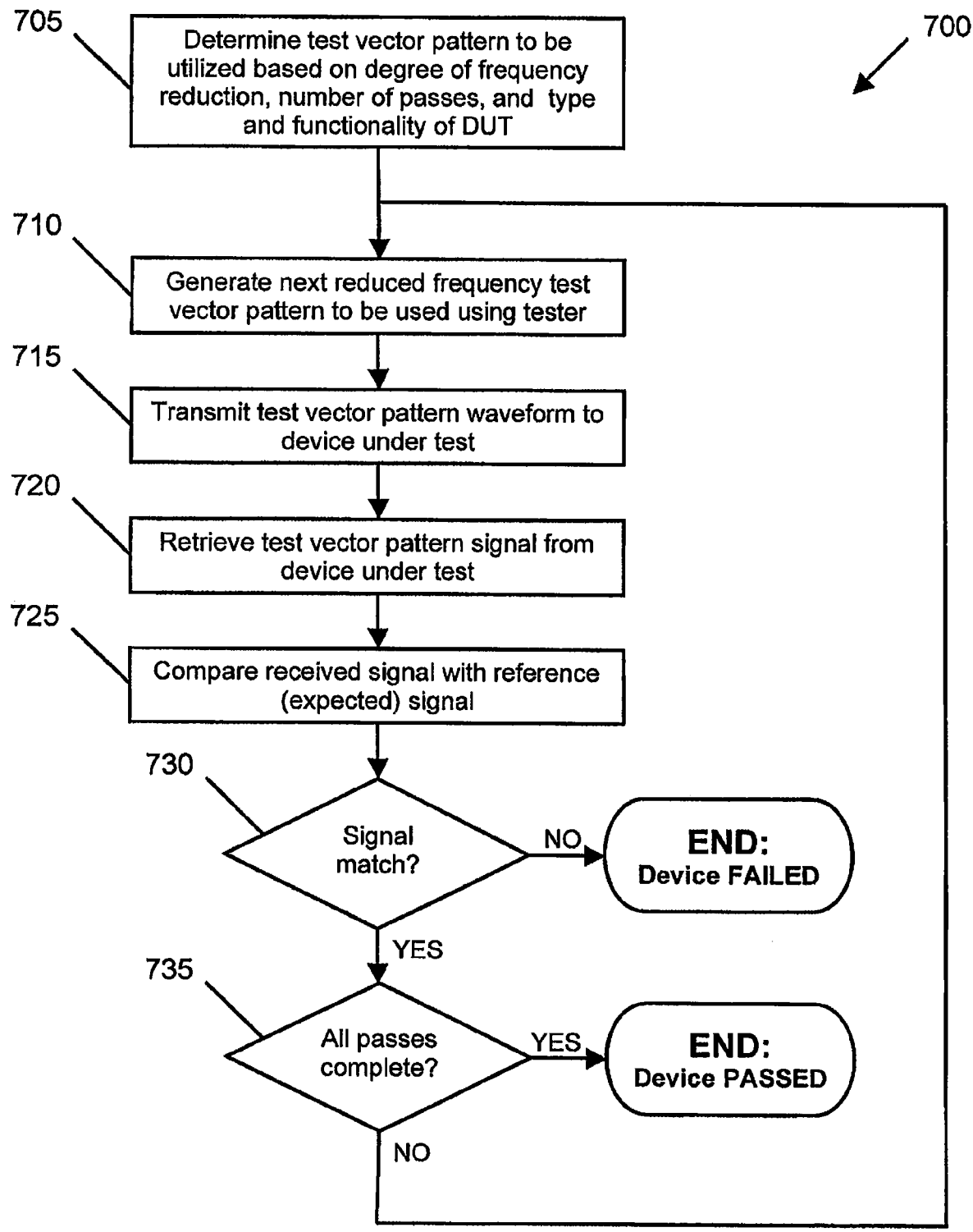
FIG. 7 is a flowchart of another method of testing a DUT using test vector patterns generated in accordance with at least one other embodiment.

Reference is now made to FIG. 7, in which a method 700 of testing a DUT 20 (FIGS. 1*a*, 1*b*), where the DUT 20 comprises either a memory module 22 (FIG. 1*a*) or an ASIC 24 (FIG. 1*b*) in accordance with another embodiment, is illustrated. Some details of method 700 may have been previously described in the present description. Many steps of method 700 are similar to certain steps of method 600 of FIG. 6. Similarities and differences in the two methods are highlighted in the paragraphs below.

Step 705 comprises determining and allocating the set of test vector patterns to be used throughout the test. Where the DUT 20 is a memory module 22, the generated set of suitable test vector patterns {M1, M2, M3, . . . } will depend on the required degree of frequency reduction and potentially also on a desired maximum number of passes. It is generally desirable that the set of test vector patterns {M1, M2, M3, . . . } be selected to facilitate exhaustive testing of the memory module. The appropriate amount of frequency reduction again depends on the passband of the communication channel 6 (FIG. 1a) and the processing speed of the DUT 20. Any set of test vector patterns {M1, M2, M3, . . . } that satisfies the previously described constraints imposed on system 2 (FIG. 1a) may be generally suitable for the determination made at this step.

Where the DUT 20 is an ASIC 24, the generated set of suitable test vector patterns {T1, T2, T3, . . . } will typically depend on the required degree of frequency reduction, the desired number of passes, the test capability of test vector pattern T, or possibly some combination of the three. The appropriate amount of frequency reduction again depends on the passband of the communication channel 6 (FIG. 1b) and the processing speed of the DUT 20. Any set of test vector patterns {T1, T2, T3, . . . } that satisfies the previously described constraints imposed on system 4 (FIG. 1b) is suitable for the present method. Step 705 thus differs from step 605 to the extent that the test vector patterns may be determined and allocated according to different requirements.

Step 710 comprises generating a reduced frequency test vector pattern, based on the set {M1, M2, M3, . . . } or {T1, T2, T3, . . . } as determined and allocated in the previous step 705. In some embodiments, the test vector patterns are generated for eventual transmission in sequence, but in other embodiments, they are generated out of sequence. Step 710 is executed in a similar manner as step 610. In particular, the TVPG 18 (FIG. 1a, FIG. 1b) generates the test vector pattern in response to an instruction fetched from process memory 12 (FIG. 1a, FIG. 1b) by micro-processor 16 (FIG. 1a, FIG. 1b) and relayed thereto.

Step 715 comprises transmitting a test vector pattern waveform, corresponding to the test vector pattern generated in the previous step 710, to the DUT 20 across the communication channel 6. Step 715 is executed in a similar manner as step 615. In particular, the TVPG 18 transmits the generated test vector pattern to the controller 14, where it is converted into an electrical waveform and outputted to the communication channel 6.

Step 720 comprises receiving a bit pattern waveform, corresponding to the digital signal produced by the DUT 20, returned from the DUT 20 across the communication channel 6 in response to the test vector pattern waveform transmitted thereto at step 715. Step 720 is executed in a similar manner as step 620. In particular, the controller 14 samples the electrical waveform received from the communication channel 6.

Step 725 comprises comparing the received bit pattern with a reference (i.e. expected) bit pattern. Where the DUT 20 is a memory module 22, or contains one or more memory modules or memory devices, the reference bit pattern is simply the test vector pattern that was generated at step 710. Step 725 is executed in a similar fashion as step 625. In particular, the controller 14 sends the sampled incoming waveform as a bit pattern to the comparator 19, where it is compared with the reference bit pattern transmitted thereto by the reference memory module 15.

On the other hand, where the DUT 20 is an ASIC 24, or contains one or more ASICs, the reference bit pattern is the expected logical output of the ASIC 24, given that particular test vector pattern (as generated at step 710) as an input. Step 725 is similar in certain aspects to step 625. In particular, the controller 14 again sends the sampled incoming waveform as a bit pattern to the comparator 19, where it is compared with a reference bit pattern. However, unlike in step 625, where the source of the reference bit pattern is the reference memory module 15 (FIG. 1a), in step 725, the source of the reference bit pattern, in this example where the device under test is an ASIC 24, is the reference logic module 17 (FIG. 1b).

Decisions 730, 735 of method 700 are generally similar as decisions 630, 635 of method 600. Decisions 730, 735 determine whether or not the method 700 continues or terminates in either case of success or failure. In particular, in some embodiments, if the comparison in step 725 produces a digital mismatch, then decision 730 results in the recordal of an error, and corresponding output if desired. In this example, method 700 ends upon determination of an error. If, however, the comparison produces a digital match, then decision 730 results in the method continuing to the extent that more passes are required.

In other embodiments, even if the comparison in step 725 produces a digital mismatch, then decision 730 results in the failure being noted and recorded, and output if desired, and the method continuing to the extent that more passes are required (e.g. flow of method steps proceeds to step 735, not shown in FIG. 7). If no more passes are scheduled, then decision 735 results in the method 700 ending. If, however, more passes are scheduled, then decision 735 results in the method returning to repeat steps 710 through 735 until all passes are completed or until the device fails, as the case may be, according to the particular embodiment. In total, the number of passes scheduled in method 700 will be determined by the size of the set {M1, M2, M3, . . . } or {T1, T2, T3, . . . }, typically comprising up to one pass for each test vector pattern in the set.

A difference between method 700 and method 600 is that the former has no step that is commensurate with step 640 of the latter. The test vector patterns {M1, M2, M3, . . . } and {T1, T2, T3, . . . } are not, in general, bit-shifted versions of each other. Therefore, if the outcome of decision 735 is to continue, the flow of steps of method 700 returns to step 710 and continues with steps 715 though 725. The next test vector pattern generated in this step 710 to be used in the method is generated independently, based on the determination and allocation in step 705, and not as a shifted test vector pattern generated relative to test vector patterns generated previously in the method. In other words, the next test vector pattern to be generated is simply one of the remaining test vector patterns in the set {M1, M2, M3, . . . } or {T1, T2, T3, . . . }. In one embodiment, the test vector patterns in a given set {M1, M2, M3 . . . } or {T1, T2, T3, . . . } are transmitted in sequential order, but in other embodiments, the test vector patterns may be transmitted in some other order.

The embodiments described herein have been shown and described by way of a number of examples. It will be apparent to those skilled in the art that changes and modifications to the described embodiments may be made without departing from the substance and scope of the described embodiments, as defined in the appended claims.

The invention claimed is:

1. A method for high-speed testing of a device under test coupled to a tester via a limited passband communication channel, the method comprising:

generating a finite plurality of test vector patterns;

transmitting each of the plurality of test vector patterns electrically to the device under test via the communication channel;

for each of the plurality of test vector patterns transmitted electrically to the device under test,
receiving a bit pattern in response to the transmission of the respective test vector pattern, the bit pattern having been transmitted electrically via the communication channel from the device under test, and
performing a comparison of the bit pattern received in response to the transmission of the respective test vector pattern with a reference bit pattern associated with the respective test vector pattern;

determining at least one test outcome, wherein each of the at least one test outcome is based on the comparison performed for a corresponding one of the plurality of test vector patterns; and at least one of recording and outputting the at least one test outcome;

wherein each of the plurality of test vector patterns, when transmitted electrically at a transmission rate via the communication channel, has a frequency content that is less than the frequency content of a high frequency test vector pattern if the high frequency test vector pattern were to be transmitted electrically at the transmission rate via the communication channel, the frequency content of the high frequency test vector pattern falling outside of the passband associated with the communication channel; and wherein the frequency content of each test vector pattern when transmitted electrically at the transmission rate via the communication channel falls within the passband associated with the communication channel.

2. The method of claim 1, wherein the finite plurality of test vector patterns is generated such that in use, the plurality of test vector patterns is capable of testing the device under test for at least each error capable of being tested by the high frequency test vector pattern.

3. The method of claim 1, wherein each of the finite plurality of test vector patterns, in use, test the device under test for one or more errors; and wherein the one or more errors tested by any one test vector pattern of the plurality of test vector patterns differs from the one or more errors tested by any other test vector pattern of the plurality of test vector patterns.

4. The method of claim 1, wherein the high frequency test vector pattern is a maximum frequency test vector pattern comprising a square-wave pulse train, the square-wave pulse train comprising alternating high and low digital values.

5. The method of claim 1, wherein the device under test comprises at least one memory component each comprising a plurality of cells.

6. The method of claim 5, wherein the device under test is configured to digitize test vector patterns received, write each bit of digitized test vector patterns to the plurality of cells, read bit values from the plurality of cells to form a bit pattern, and transmit the bit pattern electrically to the tester via the communication channel in response to the transmission of the respective test vector pattern by the tester.

7. The method of claim 5, wherein for each of the plurality of test vector patterns, the reference bit pattern associated with the respective test vector pattern is identical to the respective test vector pattern.

8. The method of claim 5, wherein the plurality of test vector patterns is generated such that, in use, the plurality of test vector patterns tests every pairing of adjacent cells of each of the at least one memory component.

9. The method of claim 5, wherein the plurality of test vector patterns comprises a first test vector pattern and at least one other test vector pattern; wherein each of the plurality of test vector patterns comprises a sequence of bit pluralities, each bit plurality comprising one or more bits; wherein all bits in any one bit plurality have the same value; and wherein for each bit plurality of the sequence, the value of the bits therein have a value different than the value of the bits in all bit pluralities of the sequence adjacent thereto.

10. The method of claim 9, wherein each of the other test vector patterns is derivable from the first test vector pattern by shifting the first test vector pattern by at least one bit.

11. The method of claim 9, wherein each bit plurality of the sequence comprises the same number of bits.

12. The method of claim 9, wherein every other bit plurality of the sequence comprises the same number of bits.

13. The method of claim 9, wherein the number of test vector patterns in the plurality of test vector patterns is equal to the number of bits in the bit plurality comprising the greatest number of bits.

14. The method of claim 1, wherein the device under test comprises at least one application-specific integrated circuit.

15. The method of claim 14, wherein the device under test is configured to digitize test vector patterns received, provide each bit of digitized test vector patterns as input to the application-specific integrated circuit, read output bit values of the application-specific integrated circuit to form a bit pattern, and transmit the bit pattern electrically to the tester via the communication channel in response to the transmission of the respective test vector pattern by the tester.

16. The method of claim 14, wherein the frequency content of each bit pattern when transmitted electrically at the transmission rate via the communication channel falls within the passband associated with the communication channel.

17. The method of claim 14, wherein for each of the plurality of test vector patterns, the reference bit pattern associated with the respective test vector pattern is the expected logical output of the application-specific integrated circuit if the respective test vector pattern were to be provided as input to the application-specific integrated circuit.

18. The method of claim 1, wherein the transmission rate at which a test vector pattern is transmitted electrically via the communication channel is equal to a full processing speed associated with the device under test.

19. A tester comprising a processor, a program memory, and a controller, configured to perform the method of claim 1.

20. The tester of claim 19, further comprising a test vector pattern generator for performing said generating, a comparator for performing the comparison, and at least one of a reference memory module and a reference logic module.

* * * * *